US006984923B1

(12) United States Patent
Walsh et al.

(10) Patent No.: US 6,984,923 B1
(45) Date of Patent: Jan. 10, 2006

(54) BROADBAND AND WIDE FIELD OF VIEW COMPOSITE TRANSDUCER ARRAY

(75) Inventors: Kenneth M. Walsh, Middletown, RI (US); Kim C. Benjamin, Portsmouth, RI (US); Stephen E. Forsythe, Portsmouth, RI (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 196 days.

(21) Appl. No.: 10/748,916

(22) Filed: Dec. 24, 2003

(51) Int. Cl.
*H01L 41/08* (2006.01)

(52) U.S. Cl. ...................... 310/334; 310/344; 310/365; 310/366; 310/326; 310/327

(58) Field of Classification Search ................ 310/322, 310/334, 344, 365, 366, 326, 327
See application file for complete search history.

(56) References Cited

U.S. PATENT DOCUMENTS 3,525,071 A * 8/1970 Massa, Jr. ................... 367/157
4,888,861 A * 12/1989 Day .......................... 29/25.35
5,122,993 A * 6/1992 Hikita et al. ................ 367/155
5,460,181 A * 10/1995 Seyed-Bolorforosh ...... 600/447
5,991,239 A * 11/1999 Fatemi-Booshehri et al. .......................... 367/164
6,081,064 A * 6/2000 Pfeiffer et al. .............. 310/334

FOREIGN PATENT DOCUMENTS

EP 0458146 A2 * 11/1991

* cited by exam iner

*Primary Examiner*—Thomas M. Dougherty
(74) *Attorney, Agent, or Firm*—James M. Kasischke; Michael P. Stanley; Jean-Paul A. Nasser

(57) ABSTRACT

A composite transducer array comprises a piezoelectric polymer composite panel, a continuous electrode coupled to a first surface of the composite panel, and a plurality of electrically-isolated electrode segments coupled to a second surface of the composite panel. Each electrode segment is shaped as an angular segment of a circular ring. The electrode segments are arranged to define an array of concentric circular rings of electrode segments.

18 Claims, 2 Drawing Sheets

BROADBAND AND WIDE FIELD OF VIEW COMPOSITE TRANSDUCER ARRAY

STATEMENT OF GOVERNMENT INTEREST

The invention described herein may be manufactured and used by or for the Government of the United States of America for Governmental purposes without the payment of any royalties thereon or therefor.

BACKGROUND OF THE INVENTION (1) Field of the Invention

The present invention relates generally to transducer arrays, and more particularly to a composite transducer array that provides a broadband frequency response over a wide field of view.

(2) Description of the Prior Art

A variety of sonar applications such as vehicle homing require the steering of acoustic beams over a wide field-of-view. Existing homing array technology uses numerous narrowband and high-power longitudinal tonpilz resonators to form the aperture of an active transducer. Each tonpilz resonator consists of several active and inactive mechanical components that work together as a spring-mass, single degree-of-freedom system. Unfortunately, tonpilz resonators are expensive to fabricate and offer only a limited operational bandwidth above their first length mode resonance.

To address operational bandwidth limitations of tonpilz resonators, recent work has focused on constructing multi-resonance tonpilz elements that have significantly greater bandwidth than that of the original single-mode tonpilz resonators. However, the fixed-size radiation head inherent to tonpilz resonators prevent their use in a "frequency agile" design in which array apertures can be varied in size.

SUMMARY OF THE INVENTION

Accordingly, it is an object of the present invention to provide a transducer array that can operate in a broadband frequency range over a wide field-of-view.

Another object of the present invention is to provide a broadband, wide field-of-view transducer array that is inexpensive to fabricate.

Other objects and advantages of the present invention will become more obvious hereinafter in the specification and drawings.

In accordance with the present invention, a composite transducer array has a central portion thereof formed by a piezoelectric polymer composite panel with opposing first and second surfaces. A continuous electrode is coupled to the first surface and a plurality of electrode segments electrically isolated from one another are coupled to the second surface. Each electrode segment is shaped as an angular segment of a circular ring, while the plurality of electrode segments are arranged to define an array of concentric circular rings of electrode segments. Each electrode segment can by independently addressed so that the array's aperture can be varied in size.

BRIEF DESCRIPTION OF THE DRAWINGS

Other objects, features and advantages of the present invention will become apparent upon reference to the following description of the preferred embodiments and to the drawings, wherein corresponding reference characters indicate corresponding parts throughout the several views of the drawings and wherein.

DESCRIPTION OF THE PREFERRED EMBODIMENT(S)

Figure 1:
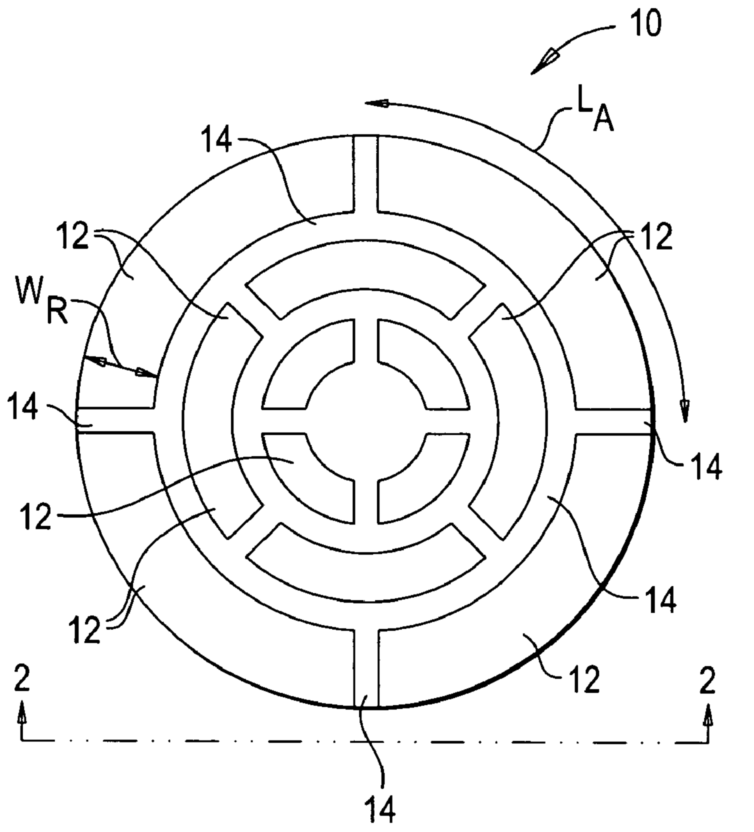
FIG. 1 is a plan view of the segmented electrode side of an embodiment of a broadband and wide field-of-view composite transducer array in accordance with the present invention.

Referring now to the drawings, simultaneous reference will be made to FIGS. 1 and 2 where a composite transducer array is shown and referenced generally by numeral 10. More specifically, FIG. 1 is a plan view depicting the segmented electrode surface of the array and FIG. 2 is a side view depicting construction details of the array.

Figure 2:
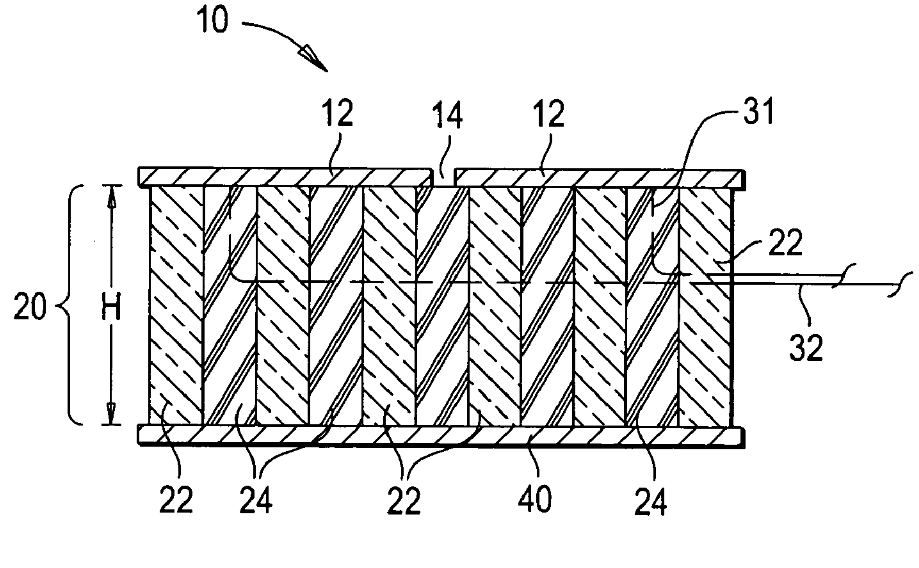
FIG. 2 is a side view of the composite transducer array taken along 2—2 of FIG. 1.

In FIG. 1, the segmented electrode surface of array 10 is defined by concentric circular rings of electrode segments 12. That is, each of electrode segments 12 is shaped as an angular segment (e.g., approximately 90° in the illustrated embodiment) of a circular ring of such electrode segments. Electrode segments 12 are electrically isolated from one another by means of spaces or gaps 14 therebetween. The size of spaces 14 between adjacent ones of electrode segments 12 is determined by diffraction theory as would be well understood by one of ordinary skill in the art. By way of illustrative example, four of electrode segments 12 are used to define an outermost circular ring of electrode segments. However, more or fewer electrode segments can be used in a circular ring thereof without departing from the scope of the present invention.

Each electrode segment 12 has a radial width $W_R$ and an arc length $L_A$. Within a given circular ring of electrode segments, the radial width $W_R$ and/or arc length $L_A$ can be the same (as shown) or different for each electrode segment in the circular ring without departing from the scope of the present invention. For example, in the outermost circular ring illustrated in FIG. 1, the radial width $W_R$ is the same for each electrode segment 12 and the arc length $L_A$ is the same for each electrode segment 12. Radial width and arc lengths can be increased or decreased with interior ones of the circular rings of electrode segments.

Construction of array 10 will now be explained with additional reference to FIG. 2. Electrode segments 12 are supported on a first major surface of a piezoelectric polymer composite panel 20. Details of a suitable composite panel 20 are described in U.S. Pat. No. 6,255,761, the contents of which are hereby incorporated by reference. Briefly, composite panel 20 is constructed using spaced-apart piezoelectric (e.g., a ferroelectric material such as piezoceramic materials lead zirconate titanate or lead titanate) columns or rods 22 that span the thickness or height H of composite panel 20. Filling the spaces between rods 22 for the full height thereof is a viscoelastic material 24 such as a thermoplastic epoxy.

Each of electrode segments 12 can have a dedicated electrical lead coupled thereto. This can be accomplished by passing conductors (e.g., conductors 31 and 32 are illustrated in FIG. 2) through a side of composite panel 20. More specifically, conductors 31 and 32 are routed through viscoelastic material 24 and electrically coupled to one of electrode segments 12. The second major surface of composite electrode panel 20 has a continuous electrode 40 coupled thereto. Typically, the height H of panel 20 is the same throughout so that planes defined by electrode segments 12 and continuous electrode 40 are parallel to one another.

Figure 3:
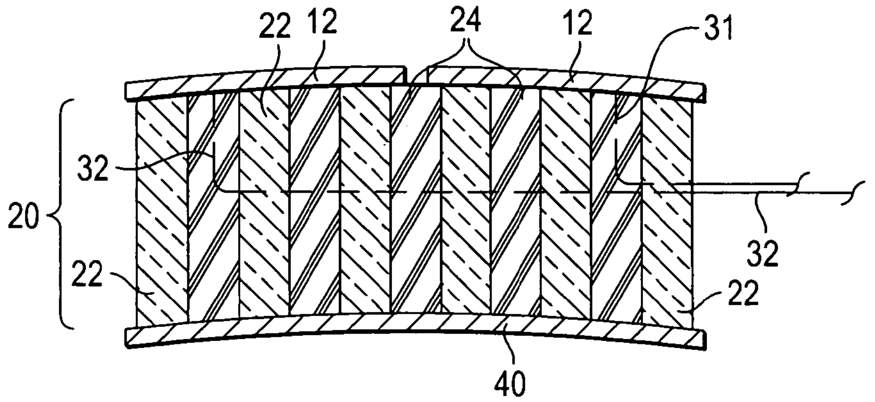
FIG. 3 is a side view of another embodiment in which the composite transducer array is shaped or curved.

Array 10 can also be shaped to conform to simple or complex contours if viscoelastic material 24 comprises a thermoplastic material such as thermoplastic epoxy. For example, as illustrated in FIG. 3, composite panel 20 has been shaped during heating thereof such that the planes defined by electrode segments 12 and continuous electrode 40 are curved in correspondence with one another.

Figure 4:
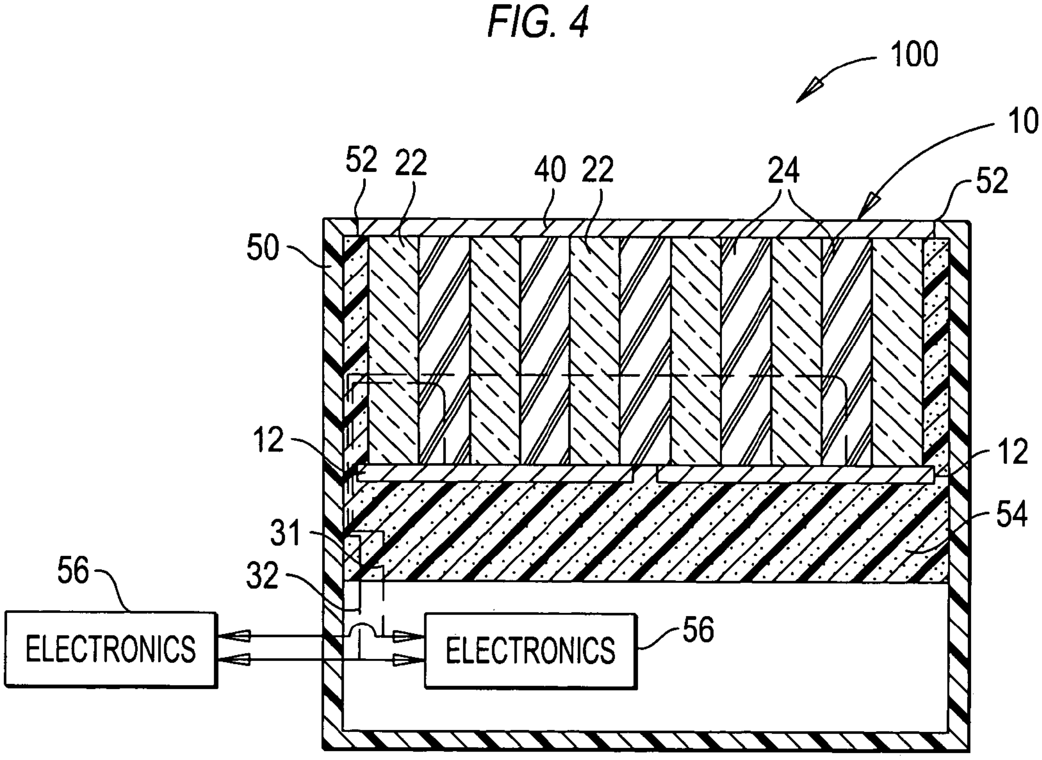
FIG. 4 is a cross-sectional view of an assembly housing the composite transducer array for use in an underwater environment.

The composite transducer array described herein can be used as part of an underwater array assembly such as assembly 100 illustrated in FIG. 4 where like reference numerals are used to describe elements of array 10 incorporated into assembly 100. A waterproof housing (e.g., a waterproof encapsulant) 50 has array 10 fitted and sealed therein such that electrode 40 is flush with and spans an opening 52 in housing 50. That is, the plane defined by continuous electrode 40 faces out of housing 50 while the plane defined by electrode segments 12 faces into housing 50. Abutting electrode segments 12 is an acoustic absorbing material 54 such as a particle-filled epoxy. Conductors 31 and 32 pass through both composite panel 20 (as described above) and acoustic absorbing material 54 before being coupled to appropriate signal electronics 56 that can be located within and/or outside of housing 50 as illustrated.

The advantages of the present invention are numerous. Broadband operation is achieved owing to the inherent broadband resonance of piezoelectric polymer composite panel 20 used to construct the transducer array of the present invention. The present invention also provides an improved spatial field-of-view since numerous elements may be formed by selectively applying electrodes over the array aperture to form elements having different (non-uniform) apertures. The invention teaches element apertures that can be varied in size by simply addressing electrode segments separately. High frequency responses are achieved using small sized electrode segments. The electrode segments can be combined for low frequency responses, or larger sized electrode segments could be used. The composite transducer array can be singly or doubly curved to any reasonable radii of curvature thereby providing a cost-effective means to realize truly conforming array apertures.

It will be understood that many additional changes in the details, materials, steps and arrangement of parts, which have been herein described and illustrated in order to explain the nature of the invention, may be made by those skilled in the art within the principle and scope of the invention as expressed in the appended claims.

What is claimed is:

1. A composite transducer array, comprising:

a piezoelectric polymer composite panel having opposing first and second surfaces;

a continuous electrode coupled to said first surface of said piezoelectric polymer composite panel; and a plurality of electrode segments electrically isolated from one another and coupled to said second surface of said piezoelectric polymer composite panel, each of said plurality of electrode segments shaped as an angular segment of a circular ring, said plurality of electrode segments arranged on said second surface to define an array of concentric circular rings of electrode segments.

2. A composite transducer array as in claim 1 further comprising a plurality of signal lines, each of said plurality of signal lines passing through said piezoelectric polymer composite panel and electrically coupled to one of said plurality of electrode segments.

3. A composite transducer array as in claim 1 wherein each of said plurality of electrode segments in a corresponding one of said concentric circular rings of electrode segments has the same radial width.

4. A composite transducer array as in claim 1 wherein each of said plurality of electrode segments in a corresponding one of said concentric circular rings of electrode segments has the same arc length.

5. A composite transducer array as in claim 1 wherein each of said plurality of electrode segments in a corresponding one of said concentric circular rings of electrode segments has the same radial width and the same arc length.

6. A composite transducer array as in claim 1 wherein said piezoelectric polymer composite panel comprises:

a plurality of piezoelectric rods spaced apart from one another and spanning between said first and second surfaces; and a viscoelastic material filing spaces between said plurality of piezoelectric rods between said first and second surfaces.

7. A composite transducer array as in claim 6 wherein said viscoelastic material comprises a thermoplastic epoxy.

8. A composite transducer array as in claim 1 wherein said continuous electrode defines a first transducer plane and said plurality of electrode segments define a second transducer plane, and wherein said first transducer plane and said second transducer plane are parallel to one another.

9. A composite transducer array as in claim 1 wherein said continuous electrode defines a first transducer plane and said plurality of electrode segments define a second transducer plane, and wherein said first transducer plane and said second transducer plane are shaped in correspondence with one another.

10. A composite transducer array assembly, comprising:

a waterproof housing open at one end thereof;

an acoustic absorbing material partially filing said waterproof housing;

a continuous electrode fitted in said waterproof housing, said continuous electrode flush with and spanning said one end thereof, wherein said continuous electrode has a first side facing into said waterproof housing and a second side facing out of said waterproof housing;

a piezoelectric polymer composite panel having opposing first and second surfaces, said piezoelectric polymer composite panel fitted in said waterproof housing with said first surface thereof coupled to said first side of said continuous electrode; and a plurality of electrode segments electrically isolated from one another and coupled to said second surface of said piezoelectric polymer composite panel, each of said plurality of electrode segments shaped as an angular segment of a circular ring, said plurality of electrode segments arranged on said second surface to define an array of concentric circular rings of electrode segments that abuts said acoustic absorbing material.

11. A composite transducer array assembly as in claim 10 further comprising a plurality of signal lines, each of said plurality of signal lines passing through said acoustic absorbing material and said piezoelectric polymer composite panel before being electrically coupled to one of said plurality of electrode segments.

12. A composite transducer array assembly as in claim 10 wherein each of said plurality of electrode segments in a corresponding one of said concentric circular rings of electrode segments has the same radial width.

13. A composite transducer array assembly as in claim 10 wherein each of said plurality of electrode segments in a corresponding one of said concentric circular rings of electrode segments has the same arc length.

14. A composite transducer array assembly as in claim 10 wherein each of said plurality of electrode segments in a corresponding one of said concentric circular rings of electrode segments has the same radial width and the same arc length.

15. A composite transducer array assembly as in claim 10 wherein said piezoelectric polymer composite panel comprises:

a plurality of piezoelectric rods spaced apart from one another and spanning between said first and second surfaces; and a viscoelastic material filing spaces between said plurality of piezoelectric rods between said first and second surfaces.

16. A composite transducer array assembly as in claim 15 wherein said viscoelastic material comprises a thermoplastic epoxy.

17. A composite transducer array assembly as in claim 10 wherein said continuous electrode defines a first transducer plane and said plurality of electrode segments define a second transducer plane, and wherein said first transducer plane and said second transducer plane are parallel to one another.

18. A composite transducer array assembly as in claim 10 wherein said continuous electrode defines a first transducer plane and said plurality of electrode segments define a second transducer plane, and wherein said first transducer plane and said second transducer plane are shaped in correspondence with one another.

* * * * *